(12) United States Patent
Kawanami et al.

(10) Patent No.: US 8,847,173 B2
(45) Date of Patent: Sep. 30, 2014

(54) GAS FIELD ION SOURCE AND METHOD FOR USING SAME, ION BEAM DEVICE, AND EMITTER TIP AND METHOD FOR MANUFACTURING SAME

(75) Inventors: Yoshimi Kawanami, Hitachinaka (JP); Shinichi Matsubara, Chofu (JP); Hironori Moritani, Hitachinaka (JP); Noriaki Arai, Hitachinaka (JP); Hiroyasu Shichi, Tokyo (JP); Tomihiro Hashizume, Hatoyama (JP); Hiroyasu Kaga, Mito (JP); Norihide Saho, Tsuchiura (JP); Hiroyuki Muto, Hitachinaka (JP); Yoichi Ose, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/811,392

(22) PCT Filed: Jul. 13, 2011

(86) PCT No.: PCT/JP2011/065977
§ 371 (c)(1), (2), (4) Date: Jan. 22, 2013

(87) PCT Pub. No.: WO2012/017789
PCT Pub. Date: Feb. 9, 2012

(65) Prior Publication Data
US 2013/0119252 A1 May 16, 2013

(30) Foreign Application Priority Data
Aug. 6, 2010 (JP) ................. 2010-177356

(51) Int. Cl.
*H01J 37/26* (2006.01)
*H01J 1/304* (2006.01)
*H01J 37/08* (2006.01)
*B23K 9/00* (2006.01)

(52) U.S. Cl.
CPC .............. *H01J 37/261* (2013.01); *H01J 37/08* (2013.01); *H01J 37/26* (2013.01); *H01J 2237/0807* (2013.01); *H01J 1/3044* (2013.01); *B23K 9/00* (2013.01)
USPC ..................... 250/423 F; 250/423 R; 250/424

(58) Field of Classification Search
USPC ................................... 250/423 R, 424, 423 F
See application file for complete search history.

(56) References Cited

U.S. PATENT DOCUMENTS

| | | | |
|---|---|---|---|
| 8,217,565 B2 * | 7/2012 | Tessner et al. ................. | 313/336 |
| 2007/0051900 A1 * | 3/2007 | Ward ........................ | 250/423 R |

(Continued)

FOREIGN PATENT DOCUMENTS

| JP | 58-85242 | 5/1983 |
|---|---|---|
| JP | 58-89763 | 5/1983 |

(Continued)

OTHER PUBLICATIONS

Hans-Werner Fink, Point Source for Ions and Electrons, Physica Scripta, 1988, pp. 260-263, vol. 38.

(Continued)

*Primary Examiner* — Michael Logie
(74) *Attorney, Agent, or Firm* — Antonelli, Terry, Stout & Kraus, LLP.

(57) ABSTRACT

To provide a gas field ion source having a high angular current density, the gas field ion source is configured such that at least a base body of an emitter tip configuring the gas field ion source is a single crystal metal, such that the apex of the emitter tip is formed into a pyramid shape or a cone shape having a single atom at the top, and such that the extraction voltage in the case of ionizing helium gas by the single atom is set to 10 kV or more.

9 Claims, 6 Drawing Sheets

(56) References Cited

U.S. PATENT DOCUMENTS

| | | | |
|---|---|---|---|
| 2008/0174225 A1* | 7/2008 | Tessner et al. | 313/362.1 |
| 2009/0001266 A1* | 1/2009 | Frosien | 250/307 |
| 2009/0152462 A1 | 6/2009 | Ishitani et al. | |
| 2009/0173888 A1 | 7/2009 | Shichi et al. | |
| 2009/0179161 A1* | 7/2009 | Ward et al. | 250/492.21 |
| 2009/0187436 A1* | 7/2009 | Shoen et al. | 705/5 |
| 2009/0230299 A1 | 9/2009 | Shichi et al. | |
| 2009/0289185 A1* | 11/2009 | Frosien et al. | 250/306 |
| 2009/0289191 A1* | 11/2009 | Frosien | 250/396 R |
| 2010/0006447 A1* | 1/2010 | Winkler et al. | 205/205 |
| 2010/0187436 A1* | 7/2010 | Frosien et al. | 250/424 |
| 2010/0294930 A1* | 11/2010 | Preikszas et al. | 250/307 |
| 2012/0068067 A1* | 3/2012 | Scipioni | 250/307 |
| 2012/0132802 A1* | 5/2012 | Arai et al. | 250/310 |
| 2012/0138815 A1* | 6/2012 | Hill et al. | 250/424 |

FOREIGN PATENT DOCUMENTS

| | | |
|---|---|---|
| JP | 7-21954 | 1/1995 |
| JP | 7-192669 | 7/1995 |
| JP | 2008-140557 | 6/2008 |
| JP | 2008-270039 | 11/2008 |
| JP | 2009-517846 | 4/2009 |
| JP | 2009-163981 | 7/2009 |
| JP | 2009-164110 | 7/2009 |
| WO | WO 2007/067328 A2 | 6/2007 |

OTHER PUBLICATIONS

Hong-Shi Kuo et al, Gas field ion source from an Ir/W<111> single-atom tip, Applied Physics Letter 92, 063106 (2008).

* cited by examiner

GAS FIELD ION SOURCE AND METHOD FOR USING SAME, ION BEAM DEVICE, AND EMITTER TIP AND METHOD FOR MANUFACTURING SAME

TECHNICAL FIELD

The present invention relates to a gas field ion source, an ion beam device using the gas field ion source, and an emitter tip configuring the gas field ion source.

BACKGROUND ART

Each of Patent Literatures 1 and 2 describes a focused ion beam (FIB) device in which a gas field ion source (GFIS) is mounted and which uses ions of gas, such as hydrogen ($H_2$), helium (He), and neon (Ne). The gas focused ion beam (gas FIB) device has the advantage of preventing that a sample is contaminated with gallium (Ga: metal) as in the case of a Ga focused ion beam (Ga-FIB) emitted from a liquid metal ion source (LMIS) which is often used at present. In addition, in the GFIS, the energy spread of gas ions extracted from the GFIS is narrow, and the source size is small. Therefore, in the GFIS, a finer beam can be formed as compared with the case of the Ga-FIB.

On the other hand, Patent Literature 3 and Non Patent Literature 1 disclose that an improvement in ion source characteristics, such as an increase in the angular current density, can be achieved in such a manner that a minute protruding portion is formed at the apex of the emitter tip of the GFIS, or that atoms arranged at the apex of the emitter tip are reduced to several atoms or less. As an example in which such minute protrusion (hereinafter referred to as "nanotip") is formed at the apex of the emitter tip, Non Patent Literature 1 and Patent Literature 2 disclose that a minute protrusion is formed from an emitter tip made of tungsten (W: metal) by using field evaporation. In this case, a nanotip is one or three atoms terminated along the [111] direction of the W single crystal. Non Patent Literature 2 and Patent Literature 4 disclose that a nanotip is formed by using a second metal (for example, a noble metal, such as iridium (Ir) or platinum (Pt)) different from the first metal material (for example, W) of the emitter tip. In this case, the nanotip is a pyramid having the surface of the second metal formed at the [111] direction terminal portion of the W single crystal.

Patent Literature 5 describes a method in which the angular current density is increased by increasing the curvature of the apex of the emitter tip in the GFIS without using the nanotip.

CITATION LIST

Patent Literature

Patent Literature 1: JP Patent Publication (Kokai) No. 7-192669
Patent Literature 2: JP Patent Publication (Kohyo) No. 2009-517846
Patent Literature 3: JP Patent Publication (Kokai) No. 58-85242
Patent Literature 4: JP Patent Publication (Kokai) No. 2008-140557
Patent Literature 5: JP Patent Publication (Kokai) No. 58-89763

Non Patent Literature

Non patent Literature 1: H.-W. Fink, Physica Scripta. 38 (1988) 260

Non patent Literature 2: H.-S. Kuo, I.-S. Hwang, T.-Y. Fu, Y.-H. Lu, C.-Y. Lin, and T. T. Tsong, Appl. Phys. Letters 92 (2008) 063106

SUMMARY OF INVENTION

Technical Problem

In order that an ion beam device, such as, for example, a scanning ion microscope (SIM), using the gas field ion source (GFIS), is used as a practical device, such as a scanning electron microscope, it is necessary to increase, by about one digit, the beam current obtained by the present technique. For this purpose, it is indispensable to improve the angular current density of the GFIS. As a method for improving the angular current density, there is a method for forming a three atom nanotip into a single atom nanotip. That is, the method, in which the current is concentrated at the single atom nanotip so as to increase the angular current density by three times, has been considered promising. However, contrary to the expectations, only a low angular current density has been obtained in this method. As a result of investigation of the present inventors, it was found that this is due to the fact that the ion emission angle of the latter is several times wider than the ion emission angle of the former. It is estimated that the cause of this is that the electric field is concentrated too much at the single atom portion at the apex of the nanotip, and hence emitted ions hardly show any influence of the surrounding electric field, that is, the lens effect does not take place.

The present invention has been made in order to solve the above-described problem. An object of the invention is to provide a GFIS in which a pyramid-shaped or cone-shaped protrusion having a single atom at the apex thereof is provided at the apex of the emitter tip, and which has a narrow ion emission angle and a high angular current density.

Solution to Problem

In the present invention, the following processes are put into a forming process of an emitter tip in order. (1) A process of forming a curved surface at the apex of the emitter tip by subjecting the apex of the emitter tip to field evaporation at an application voltage of 20 kV or more. (2) A process of forming, at the apex of the emitter tip, a pyramid-shaped or cone-shaped protrusion having a single atom at the apex thereof. In this method, the field evaporation voltage of the single atom at the apex of the emitter tip (the threshold voltage at which the single atom is field-evaporated) becomes 11 kV or more. This is synonymous with that the extraction voltage of an ion from the single atom in the case of ionizing helium gas is 10 kV or more. Further, this is synonymous with that the emission half angle of ions emitted from the single atom in the case of ionizing helium gas is 0.7° or less.

Advantageous Effects of Invention

According to the present invention, the angular current density of the minute protrusion (nanotip) at the apex of the emitter tip can be increased as compared with the prior art form. Therefore, when the gas field ion source using the nanotip according to the present invention is mounted in an ion beam device, the beam current of the ion beam device can be increased, and thereby the throughput of various kinds of processing can be improved.

DESCRIPTION OF EMBODIMENTS

In the following, embodiments of a gas field ion source (GFIS) and an ion beam device according to the present invention will be described with reference to the accompanying drawings.

<First Embodiment>

(Configuration of Ion Beam Device)

Figure 1:
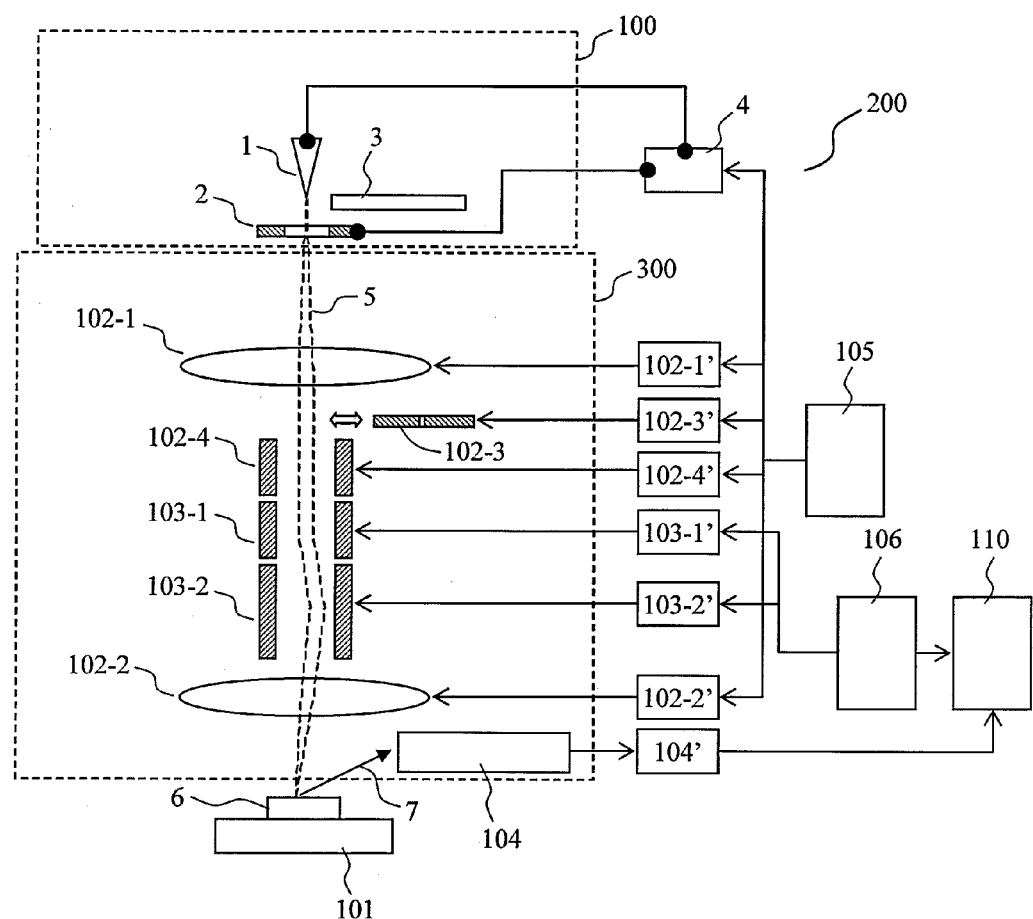
FIG. 1 is a view showing an example of an entire configuration of an ion beam device according to an embodiment.

FIG. 1 is a view showing an entire configuration of an ion beam device according to the present embodiment. An ion beam device 200 according to the present embodiment is configured such that, instead of a conventional gallium-liquid metal ion source (Ga-LMIS), a gas field ion source (GFIS) 100 of the present invention (described below) is incorporated in a focused ion beam (FIB) device which is manufactured to use the conventional gallium-liquid metal ion source (Ga-LMIS).

In FIG. 1, the ion beam device 200 adopts a configuration in which an ion beam 5 emitted from the GFIS 100 is made incident on an ion optical system 300, and in which the ion beam 5 converged by the ion optical system 300 is then irradiated onto a sample 6 mounted on a sample stage 101.

The GFIS 100 includes an emitter tip 1, an extraction electrode 2, and a gas injection port 3 of a gas supply pipe 30 (FIG. 2) which supplies gas for ionization to the apex of the emitter tip 1. From an extraction voltage supply section 4, a high voltage is applied between the emitter tip 1 and the extraction electrode 2 (so that the side of the emitter tip 1 is set to be positive and the side of the extraction electrode 2 is set to be negative). By this high voltage, the gas supplied from the gas injection port 3 and locating around the apex of the emitter tip 1 is ionized. The extraction electrode 2 extracts the ions generated by the emitter tip 1 so as to make the ions emitted as the ion beam 5 to the optical system 300.

The ion optical system 300 includes a lens system 102 including electrostatic lenses 102-1 and 102-2, a beam-limiting aperture 102-3, and an aligner 102-4, and a deflection system 103 including deflectors 103-1 and 103-2. The ion beam 5, which is made incident on the ion optical system 300, is converged by the electrostatic lenses 102-1 and 102-2 in the optical system, so as to be irradiated onto the sample 6. The position on the sample 6, onto which the ion beam 5 is irradiated, is adjusted by deflecting the ion beam 5 by the deflectors 103-1 and 103-2.

The lens system 102, which includes the electrostatic lenses 102-1 and 102-2, the beam-limiting aperture 102-3, and the aligner 102-4, is driven and controlled by corresponding drivers 102-1' to 102-4'. The drivers 102-1' to 102-4' are controlled by a lens system controller 105. Further, the lens system controller 105 also controls the ion beam 5 emitted to the ion optical system 300 through the drive control of the extraction voltage supply section 4. On the other hand, the deflection system 103, which includes the deflectors 103-1 and 103-2, is driven and controlled by corresponding drivers 103-1' and 103-2'. The drivers 103-1' and 103-2' are controlled by a deflection system controller 106.

Secondary electrons 7 generated from the sample 6 by the irradiation of the ion beam 5 described above are detected by a secondary electron detector 104, and are converted into a digital signal via an A/D signal conversion section 104'. Then, the digital signal is supplied to a display 110 including an image generation section. The display 110 forms a secondary electron observation image in which the intensity of the digital signal is associated with the deflection intensity. While observing the secondary electron observation image displayed on the display 110, a user specifies and inputs, on the display screen, the irradiation position of the ion beam 5. The specification input is received by a control section (not shown), so as to be used for the deflection control of the deflection controller 106.

Note that the details of the control section, which controls the entire device including these controllers (the lens system controller 105 and the deflection system controller 106) and the display 110, are not shown in FIG. 1.

(Configuration of Gas Field Ion Source)

Figure 2:
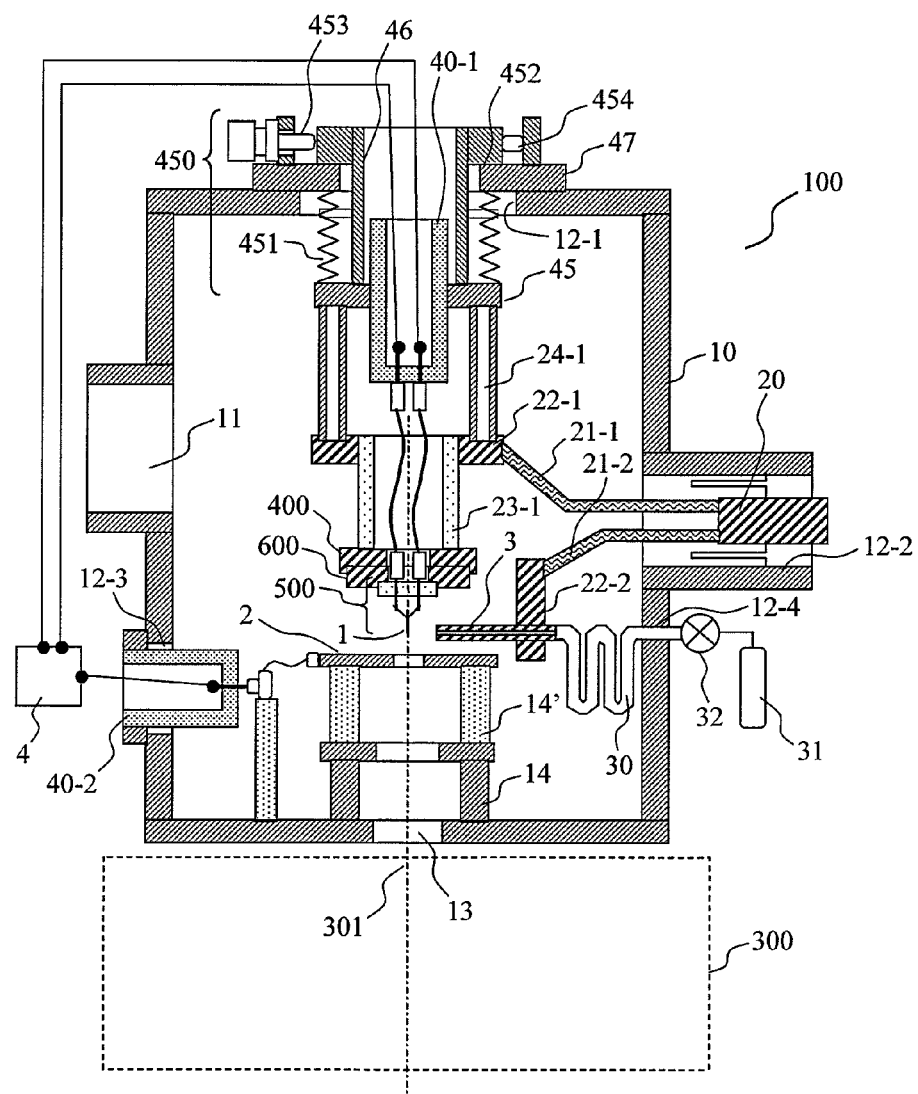
FIG. 2 is a view showing an example of a configuration of a gas field ion source.

FIG. 2 is a view showing an example of a configuration of a gas field ion source (GFIS) 100 shown in FIG. 1.

In the present embodiment, the emitter tip 1, the extraction electrode 2, and the gas injection port 3 are arranged in an ultra-high vacuum atmosphere independent of the atmosphere of the ion optical system 300 in which the lens system 102 and the deflection system 103 are arranged. For this reason, a vacuum chamber 10 accommodating therein the emitter tip 1, and the like, is formed by a case which is independent of the ion optical system case (not shown) accommodating therein the devices of the ion optical system 300. That is, the gas field ion source (GFIS) 100 is configured as a unit.

The vacuum chamber 10 is formed by a box body in which an vacuum pumping port 11, respective mounting ports 12 (an ion source sub-unit mounting port 12-1, a cold head mounting port 12-2, a high voltage feedthrough mounting port 12-3, a gas supply pipe introduction port 12-4), and an differential pumping port 13 are formed. The inside of the vacuum chamber 10 is maintained at ultra-high vacuum of order of $10^{-8}$ Pa by an vacuum pumping system (not shown) connected to the vacuum pumping port 11, for example. The differential pumping port 13 is an opening for emitting the ion beam 5 to the ion optical system 300. The vacuum chamber 10 is configured such that, in the state where the vacuum chamber 10 is integrally attached to the ion optical system case, the differential pumping port 13 is used as a boundary so that the inside of the vacuum chamber 10 can be exhausted by the vacuum pumping system independently of the ion optical system 300. In a wall portion facing the wall portion in which the ion source sub-unit mounting port 12-1 of the vacuum chamber 10 is formed, the differential pumping port 13 is arranged and formed so as to face the ion source sub-unit mounting port 12-1.

The extraction electrode 2 is provided in the vacuum chamber 10 in the state where, by a support member 14 vertically provided on the container inner wall portion, the extraction electrode 2 is supported so that the beam extraction hole is arranged coaxially with the differential pumping port 13. At least a part of the support member 14 is formed of an insulating member 14' so that the extraction electrode 2 and the vacuum chamber 10 are insulated from each other. The extraction electrode 2 is connected to a high voltage feedthrough 40-2 fitted to the high voltage feedthrough mounting port 12-3 so as to receive the supply of the extraction voltage from the extraction voltage supply section 4. The gas supply pipe 30 is introduced into the vacuum chamber 10 via the gas supply pipe introduction port 12-4, so as to supply gas for ionization from the gas injection port 3 arranged in the vicinity of the apex of the emitter tip 1. The proximal end side of the gas supply pipe 30 is connected to a gas cylinder 31 via a valve 32. In the gas supply pipe 30, the portion of the gas injection port 3 is made of oxygen-free copper having a good heat transfer property, and the portion of the gas supply pipe 30 except the gas injection port 3 is made of stainless steel having a poor heat conduction property. Further, the portion of the gas injection port 3 is supported by a heat transfer support body 22-2 made of oxygen-free copper having a good heat transfer property in the vacuum chamber 10. In addition, the gas injection port 3 is configured such that a curved portion is formed in the middle portion of the gas supply pipe 30 in the vacuum chamber 10 and thereby the heat conduction distance is increased to prevent the transfer of heat from the outside.

In the illustrated example, the ion source sub-unit includes a horizontal fine movement mechanism 450, a terminal fitting section 45 to which a high voltage feedthrough 40-1 is fitted, a heat insulation support body 24-1 which is formed by a plurality of thin stainless steel pipes, so as to prevent the penetration of heat from the outside, an annular heat transfer support body 22-1 formed of oxygen-free copper, a hollow columnar heat transfer insulator 23-1 made of sapphire, and a support body 400 at which a tip assembly 500 including the emitter tip 1 is positioned via an inclination spacer 600.

In the ion source sub-unit, the terminal fitting section 45 is connected and fixed integrally to a movable section 46 of the horizontal fine movement mechanism 450, and the terminal fitting section 45 is connected and fixed integrally to the heat transfer support body 22-1 via the heat insulation support body 24-1. Further, the base portion of the heat transfer insulator 23-1 is fitted and fixed to the hole portion of the annular heat transfer support body 22-1, and the support body 400 is fitted and fixed to the tip portion of the heat transfer insulator 23-1. Further, in the state where these are integrally connected and fixed to each other, the movable section 46 of the horizontal fine movement mechanism 450, and the heat transfer insulator 23-1 are positioned and fixed coaxially with each other. Further, the support body 400 is fitted and fixed coaxially to the heat transfer insulator 23-1. Thereby, the movable section 46 of the horizontal fine movement mechanism 450, and the support body 400 are coaxially arranged so that the central axis of the movable section 46 coincides with the central axis of the support body 400.

The horizontal fine movement mechanism 450 includes a plate-shaped annular base 47, the movable section 46 inserted into the central hole of the annular base 47 with a gap therebetween, and a positioning mechanism for arranging and adjusting the movable section 46 in the central hole of the annular base 47. A flange portion, which has a diameter larger than the diameter of the central hole of the annular base 47 and which enables the movable section 46 to be supported by the sliding surface 452 of the surface of the annular base 47, is formed on the outer periphery of the movable section 46. The flange surface of the flange portion of the movable section 46 is brought into contact with the sliding surface 452 of the surface of the annular base 47, so that the movable section 46 is supported by the annular base 47 so as to be slightly movable. The positioning mechanism is configured by a push rods 453 and a compression spring 454 which are arranged on the annular base 47 so that the flange portion of the movable section 46 is sandwiched between the push rods 453 and the compression spring 454 in the radial direction of the flange portion. Thereby, the position of the movable section 46 in the central hole of the annular base 47 can be adjusted by adjusting the forward and backward position of the push rod 453 against the urging force of the compression spring 454.

In the horizontal fine movement mechanism 450, the rear surface of the annular base 47 is attached to the vacuum chamber 10 in an airtight manner by being brought into contact with the outer surface of the vacuum chamber 10 so that the central hole of the annular base 47 and the ion source sub-unit mounting port 12-1 of the vacuum chamber 10 are arranged coaxially with each other. The ion source sub-unit mounting port 12-1 of the vacuum chamber 10 is formed larger than the movable section 46 of the horizontal fine movement mechanism 450, and the width dimension of each of the portions of the ion source sub-unit, which include the terminal fitting section 45 and which are arranged in the vacuum chamber 10. Therefore, the ion source sub-unit can be attached to the vacuum chamber 10. Further, a vacuum bellows 451 is provided between the rear surface of the sliding surface 452 of the surface of the annular base 47 of the horizontal fine movement mechanism 450, and the terminal fitting section 45, so as to surround the movable section 46. It is only necessary that the vacuum bellows 451 is provided to partition between the inside of the vacuum chamber 10 and the sliding surface 452 of the surface of the annular base 47 of the horizontal fine movement mechanism 450. Therefore, the surface area of the vacuum bellows 451 is suppressed.

A voltage is applied to the emitter tip 1 from the extraction voltage supply section 4 via the high voltage feedthrough 40-1 fitted to the terminal fitting section 45. Only one wiring, which supplies an electric potential to the emitter tip 1 via the high voltage feedthrough 40-1, is necessary for ionization. In the present embodiment, two wirings are used for heating the filament section provided at the root of the emitter tip 1.

A cold head 20 (for example, Gifford-McMahon refrigerator) is connected to the cold head mounting port 12-2 of the vacuum chamber 10 from the outside of the container. The cold head 20 is connected to the heat transfer support body 22-1 of the ion source sub-unit via a heat transfer mesh wire 21-1 made of oxygen-free copper, and is also connected, via a heat transfer mesh wire 21-2 made of oxygen-free copper, to the heat transfer support body 22-2 supporting a part of the gas injection port 3. The heat transfer mesh wires 21-1 and 21-2, and the heat transfer support bodies 22-1 and 22-2 are further gold plated in order to reduce the heat radiation.

The emitter tip 1 is cooled by performing heat exchange between itself and the cold head 20 introduced from the outside of the vacuum chamber 10 via the heat transfer mesh wire (oxygen-free copper) 21-1, the heat transfer support body (oxygen-free copper) 22-1, and the heat transfer insulator (sapphire) 23-1. Further, the portion (oxygen-free copper) of the gas injection port 3 is cooled by performing heat exchange between itself and the cold head 20 via the heat transfer mesh wire (oxygen-free copper) 21-2, and the heat transfer support body (oxygen-free copper) 22-2.

Each of the members has excellent thermal conductivity, and hence the emitter tip 1 and the portion of the gas injection port 3 are cooled to substantially the same temperature. In addition, penetration of heat from the outside is prevented by the heat insulation support body 24-1 (stainless steel) of the ion source sub-unit, and by the portion of the gas supply pipe 30 (stainless steel) except the gas injection port 3. Further, several heat-shield walls may be added in order to stably maintain the temperature of each of the portions.

In the gas field ion source (GFIS) 100 of the present embodiment configured as described above, an atomic level pyramid structure, which is made of iridium (Ir) and which is formed on the W(111) crystal facet at the tip of a single crystal of tungsten (W), is used as the emitter tip 1. Helium (He) is used as the gas for ionization. The temperature of the emitter tip 1 and the gas injection port portion 3 is maintained at about 20 K. Further, when the voltage is applied by the extraction voltage supply section 4 in the state where the emitter tip 1 is set to be positive and the extraction electrode is set to be negative, a part of the gas atoms (also molecules in some cases), which are ejected from the gas injection port portion 3 to reach the apex of the emitter tip 1, are field ionized to positive ions at a certain applied voltage, so that the ion emission occurs. Here, the ion extraction voltage is set to about 12 kV.

(Tip Shape and Drive Condition of Emitter Tip)

Next, there will be described the method for controlling the shape of the emitter tip 1 configuring the gas field ion source (GFIS) 100 according to the present embodiment, and an improvement of the angular current density by the control of the shape of the emitter tip 1.

Figure 3A:
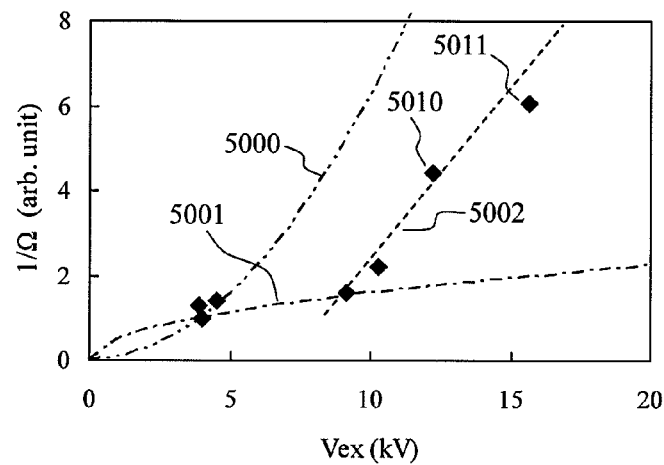
FIG. 3A is a graph showing a relationship between the extraction voltage and the reciprocal of the emission solid angle Q (square of emission half-opening angle θ) with respect to the shape of the emitter tip.

The emitter tip 1 according to the present embodiment is selected from several emitter tips prepared beforehand. FIG. 3A shows graphs which are obtained by arranging the reciprocal of the emission solid angle $\Omega$ (represented as $\pi\theta^2$ when the emission half-opening angle is set as $\theta$) of ions emitted from the emitter tips with respect to the ion extraction voltage Vex. In these emitter tips, the ion emitting area is basically limited to a single atom at the apex of the emitter tips. For this reason, the change in the reciprocal of the emission solid angle $\Omega$ directly corresponds to the change in the angular current density.

First, as described in Patent Literature 5, it is estimated that, in the case where the shape of the tip of an emitter tip is formed in a simple curved surface shape (hemisphere shape), a strong lens effect occurs at the apex of the emitter tip, and thereby the reciprocal of the emission solid angle $\Omega$ is changed as indicated by a curve 5000.

On the other hand, it was estimated that, in the case where the ions are only accelerated without occurrence of the lens effect at the tip of an emitter tip, the reciprocal of the emission solid angle $\Omega$ is changed as indicated by a curve 5001. Here, no occurrence of the lens effect means that, when the ions are accelerated in the same range of applied voltage, the emission solid angle is held at the same level, and there is no substantial difference in the characteristics.

Next, when the emitter tips of various extraction voltages Vex, which have atomic level pyramid, were investigated, the reciprocal of the emission solid angle $\Omega$ was changed in the range of the applied voltage of about 10 kV or less, as indicated by the curve 5001 without occurrence of the lens effect at the apex of the emitter tip. From the above-described results of investigation, it was found that the conventional idea as indicated by the curve 5000 cannot be applied to the emitter tip 1 having the atomic level pyramid structure at the apex of the emitter tip. However, when the change in the reciprocal of the emission solid angle $\Omega$ of the emitter tip 1 was investigated by further increasing the extraction voltage Vex, it was found that the graph rises rapidly and the lens effect occurs at the apex of the emitter tip. The transition of the change occurs along a straight line 5002. The boundary (criteria), at which this phenomenon is generated in the emitter tip having a single atom at the apex thereof, is about 10 kV as for the extraction voltage of helium (at which voltage a best image is obtained). This corresponds to 0.7° of the emission half-opening angle of ions emitted from the single atom at the apex of the emitter tip. Further, the voltage required to field-evaporate the single atom at the apex of the emitter tip corresponds to about 11 kV.

Figure 3B:
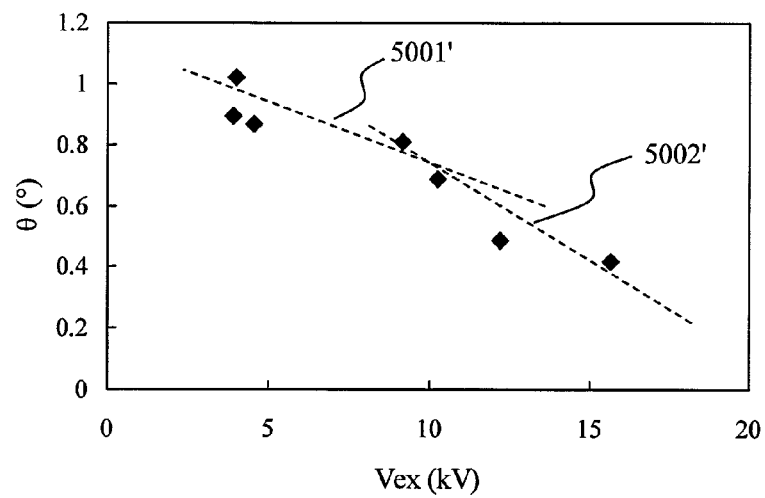
FIG. 3B is a view showing the change of the emission half-opening angle θ with respect to the extraction voltage Vex of helium.

These correspondence relationships are described. FIG. 3B shows changes in the emission half-opening angle $\theta$ with respect to the extraction voltage Vex of helium. The approximate line of the extraction voltage Vex is bent near about 10 kV from the straight line 5001' to the straight line 5002'. The change in the emission half-opening angle $\theta$ with respect to the extraction voltage Vex is more gradual as compared with the change in the emission solid angle $\Omega$ shown in FIG. 3A, and hence a change point is difficult to be clearly found when the change in the emission half-opening angle $\theta$ with respect to the extraction voltage Vex is illustrated as a single figure. However, the change point surely exists. The emission half-opening angle $\theta$ at this time is about 0.7°. In the region of the emission half-opening angle $\theta$ smaller than this value, the shape of the emitter tip, in which shape the emission solid angle $\Omega$ is rapidly increased, is realized.

Figure 3C:
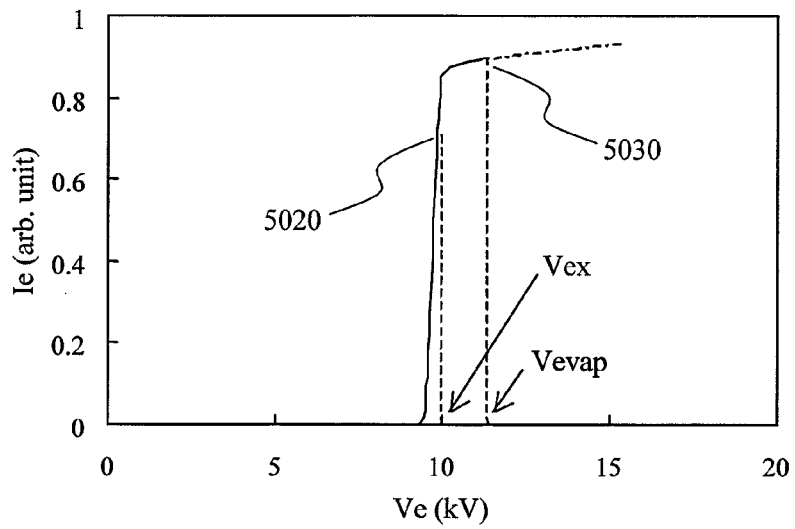
FIG. 3C is a view showing the change of the emitted ion current Ie with respect to the applied extraction voltage Ve.

Next, FIG. 3C shows changes in the emitted ion current Ie with respect to the voltage between a certain emitter tip and the extraction electrode, that is, with respect to the applied extraction voltage Ve. As the applied extraction voltage Ve is increased, the emitted ion current Ie is rapidly increased from a certain voltage, so that the emitted ion current Ie starts to be saturated and the applied extraction voltage Ve becomes the Vex (best image voltage). At this voltage, the FIM (Field Ion Microscope) image becomes sharpest. In this specification, the ion extraction voltage in each of arbitrary emitter tips is defined as Vex and used.

When the applied extraction voltage Ve is further increased to reach the field evaporation voltage of Vevap, the atom at the apex of the emitter tip is removed by field evaporation. The ratio of the extraction voltage (best image voltage) Vex and the field evaporation voltage Vevap becomes a fixed value without depending on the shape of the emitter tip. In FIG. 3A, the voltage, at which the single atom at the apex of the emitter tip having the extraction voltage (best image voltage) of about 10 kV is field-evaporated, corresponds to about 11 kV. Therefore, in the emitter tip in which the field evaporation voltage of the single atom at the apex of the emitter tip is about 11 kV or more, the shape of the emitter tip is realized so that the emission solid angle $\Omega$ is rapidly increased.

As described above, the characteristics of the shape of an emitter tip can be expressed by Vex, $\theta$, or Vevap which are characteristic values of the emitter tip (having a single atom at the apex of the emitter tip), and these values are dependent on each other.

It should be noted that, strictly speaking, even in the emitter tip having the same shape, the above-described characteristic values are slightly changed by the operating temperature of the emitter tip, and the like. FIG. 3A shows the case where the operating temperature of the emitter tip is about 80 K. For example, when the operating temperature is set to 20 K, a correction to reduce the extraction voltage (best image voltage) of each of the emitter tips by about 15% is necessary. The field evaporation voltage Vevap is not sensitive to the operating temperature of the emitter tip. The field evaporation voltage Vevap is almost unchanged at the operating temperature of 50 K or less, and is changed only by several percent even when the operating temperature is raised to 80 K.

However, the field evaporation voltage Vevap is dependent on the kind of the single atom at the apex of the emitter tip. The above description with reference to FIG. 3C is related to the emitter tip whose tip is covered with Ir. When the single atom at the apex of the emitter tip is W, the field evaporation voltage Vevap is increased by about 5% to 10%. In consideration of the above discussion, it is necessary that, in an emitter tip having a single atom at the apex thereof, the boundary of each of the characteristic values, which boundary represents whether or not the lens effect is rapidly increased at the apex of the emitter tip, is regarded as having a width of about ±10% in the case where the measurement environment is not strictly specified.

The emitter tip 1 according to the present embodiment corresponds to the plot 5100 among the plurality of plots on the straight line 5002 shown in FIG. 3A. In the results of measurement in the state in which helium gas of about 0.5 Pa was supplied to the vicinity of the emitter tip 1, and in which the applied extraction voltage was slightly increased from the best image voltage to the gas supply restriction region, to maximize the current, the emission current from the single atom was 460 pA, and the emission half-opening angle θ from the single atom was about 0.5°. The emission half-opening angle of the emitter tip 1 is reduced by half as compared with the conventional emitter tip 1. The angular current density was about 2.0 μA/sr.

(Manufacturing Method of Emitter Tip)

Figure 4:
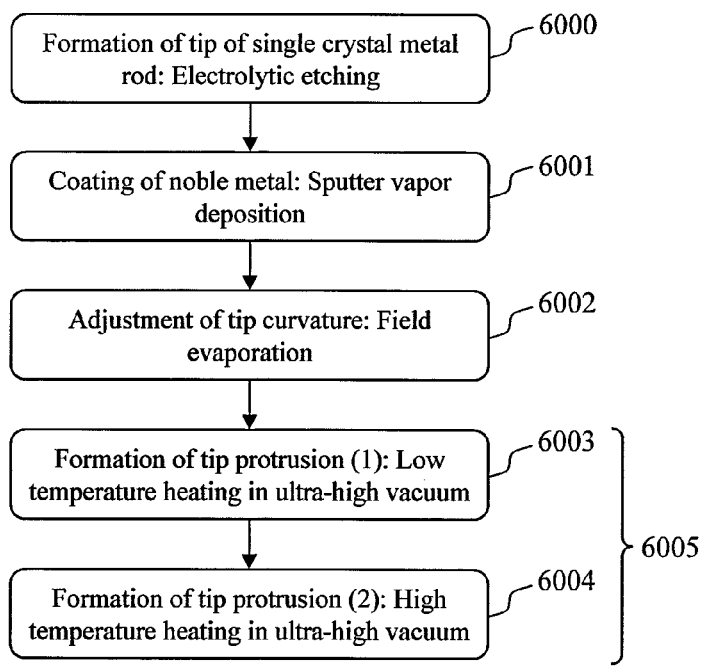
FIG. 4 is a view for explaining an example of a process of forming an emitter tip according to an embodiment.

FIG. 4 shows a manufacturing method of the emitter tip 1 according to the present embodiment. The emitter tip 1 is manufactured by using a group of devices basically different from the GFIS 100, but the process 6002 and the processes subsequent to the process 6002 can be performed in the GFIS 100.

First, in process 6000, the tip of a single crystal rod is formed in a needle-like shape by electrolytic etching. Here, W single crystal having the [111] crystal axis aligned with the longitudinal direction of the rod was used. In the electrolytic etching, after the tip of the W single crystal rod is dipped in sodium hydroxide (NaOH) aqueous solution and further the tip is cut and sharpened by applying a DC voltage, the cone angle of the tip is adjusted by applying an AC voltage. Here, a cone was formed in the region within about 1 μm from the tip so as to have the half angle of about 15°. Note that this cone angle has no direct effect on the ion emission angle θ.

Next, in process 6001, the needle-shaped tip of the W single crystal rod is covered with Ir. Since Jr has a high melting point, Ir is coated in thickness of about 7 nm by sputter vapor deposition in vacuum. The surface of the W single crystal rod serving as the under layer of the Jr coating is slightly oxidized. This Jr coating process is necessary to form a protrusion at the tip of the W single crystal rod in the final process.

Next, in process 6002, the tip of the W single crystal rod is subjected to field evaporation to adjust the curvature of the tip. Conventionally, the adjustment of the curvature of the tip has been performed by electrolytic etching in process 6000. For this reason, the variation in the curvature of the tip has been large. However, the curvature of the apex of the emitter tip could be stabilized by finally adjusting the curvature of the tip by field evaporation as in the present embodiment. Note that this process was performed in helium gas in order to observe the state of the tip by a FIM (Field Ion Microscope) image.

Next, in process 6005 consisting of process 6003 and process 6004, a triangular pyramid-shaped protrusion (pyramid) is formed on the crystal face (111) at the tip of the W single crystal rod.

In process 6003, the Ir coating, which is peeled together with the oxide layer from the tip surface by the field evaporation in process 6002, is replenished. For example, the emitter tip after being subjected to process 6002 is heated in vacuum for 10 minutes at a temperature (about 400° C. to about 500° C.) at which the emitter tip is not red-heated. By this heating, Jr is diffused from the root of the W single crystal rod, so that the apex of the emitter tip is coated with Ir. In this heating, the emitter tip is prevented from being red-heated, so that any structural change of the surface of the W single crystal rod is avoided and Jr is uniformly diffused.

In process 6004, the W single crystal rod coated with one or more monoatomic layers of Jr is heated to a predetermined temperature, and thereby the Jr layer is formed into a single layer. Then, the crystal face (211) of the W single crystal rod is made to grow (by facet growth), so that a triangular pyramid-shaped protrusion (pyramid) having a single atom at its apex is formed at the apex of the emitter tip. Here, the heating was performed for 10 minutes at 930° C. continuously from process 6003.

The facet was sufficiently grown at about 850° C. in a conventional emitter tip having a small tip curvature. However, as in the present embodiment, as the tip curvature of the base body was increased, a higher temperature was required. This is considered to be due to the fact that the amount of movement of atoms is increased as the tip curvature of the base body is increased. Depending of the temperature conditions, the pyramid was grown so that the ridge line thereof was brought into contact with the curved surface of the base body.

The manufacturing method of the emitter tip 1 according to the present embodiment 1 is firstly featured in that the process of adjusting the tip curvature by field evaporation, and the process of forming a pyramid-shaped or cone-shaped protrusion having a single atom at the apex thereof are included in the manufacturing method in this order. The manufacturing method of the emitter tip 1 according to the present embodiment 1 is secondly featured in that the field evaporation described above is performed at a voltage not less than about 20 kV. In order to obtain a strong lens effect in the emitter tip having a single atom at the apex thereof, the former is a necessary condition, and the latter is a sufficient condition. As a result, the extraction voltage Vex of helium ions exceeds about 10 kV.

Here, when the withstand voltage of the manufacturing apparatus is increased and field evaporation is performed at a higher voltage, the extraction voltage Vex can be increased, so that the angular current density can be further improved. It is not difficult to make a manufacturing apparatus having a field evaporation voltage of 40 to 60 kV. The voltage in this range corresponds to 20 to 30 kV of the extraction voltage Vex for extracting helium ions from the single atom at the apex of the emitter tip. Theoretically, the extraction voltage Vex can be increased higher than this range of voltage, but in the ordinary ion beam device 200, the acceleration voltage is set in the range of 30 to 40 kV. Therefore, when the extraction voltage Vex is increased higher than this range of voltage, it becomes difficult to use the ordinary ion beam device 200.

Figure 5:
FIG. 5 is a scanning electron micrograph of the tip portion of the emitter tip according to the embodiment (after etching).
Figure 6:
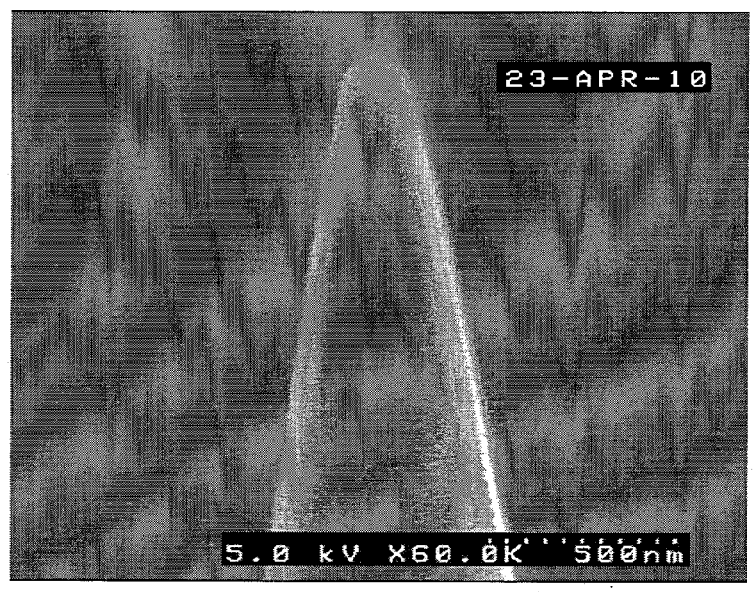
FIG. 6 is a scanning electron micrograph of the tip portion of the emitter tip according to the embodiment (after formation of a triangular pyramid-shaped protrusion).
Figure 7:
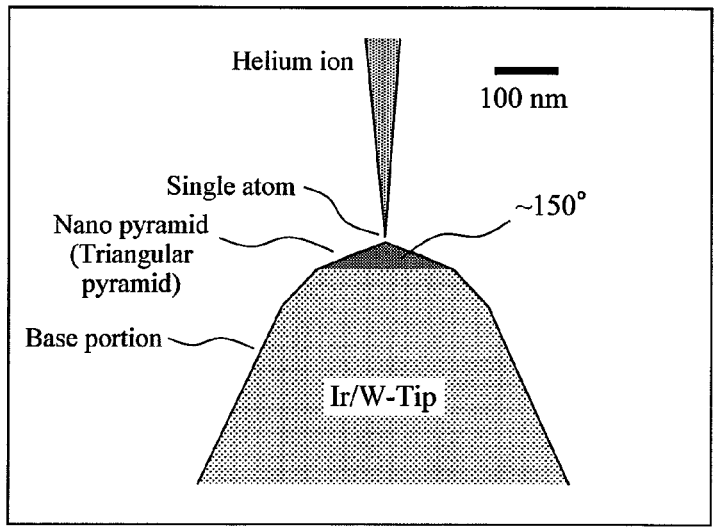
FIG. 7 is an enlarged view of the apex of the emitter tip shown in FIG. 6.

FIG. 5 to FIG. 7 respectively show the emitter tip 1 of the present embodiment, that is, SEM photographs of the emitter tip shown in plot 5010 in FIG. 3A. FIG. 5 is an SEM photograph of the emitter tip after the electrolytic etching (process 6000). FIG. 6 is an SEM photograph of the emitter tip after a triangular pyramid-shaped protrusion (pyramid) is formed at the tip portion of the emitter tip 1 after the etching. FIG. 7 is a further enlarged schematic view of the tip portion of the emitter tip shown in FIG. 6. The apex of the emitter tip shown in FIG. 6 has a curved surface formed in such a manner that the tip is peeled and cut by field evaporation effected at 25 KV. On the other hand, the triangular pyramid-shaped protrusion is formed by facet growth so that the ridge line of the protrusion is brought into contact with the curved surface at the apex of the emitter tip subjected to field evaporation. Although the resolution of SEM is insufficient for accurately determining the size of the protrusion, it is estimated from observation of an FIM image that the length of the ridge line of the protrusion is about 10 nm. Note that, as shown in FIG. 7, it is estimated that the angle formed by the apex and the ridge line of the protrusion is about 150°.

(Reproduction of Tip of Emitter Tip Based on Preset Conditions)

In the emitter tip which is used in the GFIS and in which the number of atoms at the tip thereof is very small, there is observed a phenomenon in which the atom at the apex of the emitter tip is peeled by an electric field smaller than the original electric field due to the adsorption of impurity gas contained in the imaging gas (here helium). The life of the emitter tip is determined by this phenomenon. The impurity gas is also originated from the device inner wall, and the like. For this reason, the life of the emitter tip varies for each device.

However, if the lost atom at the tip of the emitted chip can be automatically reproduced in the gas field ion source in a short time, the substantial life of the emitter tip is not exhausted. In the emitter tip of the present embodiment, a single atom at the apex of the emitter tip can be reproduced in process 6005 in FIG. 4. Note that, also when only several atoms are lost from the apex of the emitter tip, the atoms can be similarly reproduced.

Specifically, in process 6003, a noble metal (here Ir) lost from the surface of the apex of the emitter tip is replenished to the tip, and in subsequent process 6004, the arrangement of atoms at the apex of the emitter tip is again performed. It is desirable that the operating conditions of this process are stored as preset conditions in the controller of the ion beam device 200. By execution of process 6003 and process 6004, a protrusion (pyramid) having a single atom at the apex thereof is reproduced at the tip portion of the emitter tip.

Since process 6003 and process 6004 are performed in vacuum, the time required for the reproduction of the protrusion is about 1 hour when the exhaustion and injection of gas is taken into consideration. The heating of the emitter tip is performed by local energization, and hence the temperature of the portion performing conduction cooling of the portion of the emitter tip is maintained at a low temperature. The detailed conditions of the reproduction process described above may be fixed conditions (preset conditions) which are determined beforehand independently of the state of the emitter tip, and hence require no determination by the user. Therefore, there is no difficulty in configuring the control system so that the emitter tip is automatically reproduced on the basis of the preset conditions.

Note that the heating temperature and the heating time in processes 6003 and 6004 can also be reduced as compared with the heating temperature and the heating time at the time when the apex of the emitter tip is first formed. This is because the amount of material to be moved at the time of formation of the protrusion is reduced. Further, in many cases, the reproduction described above is also performed when the emitter tip is transferred into the GFIS after being completed by the manufacturing apparatus.

(Influence on Alignment by Reproduction of Emitter Tip)

On the other hand, in the case where the apex of the emitter tip is reproduced, when the extraction voltage Vex is greatly changed before and after the reproduction, the ion optical system needs to be realigned. The extra working time required for the realignment may reduce the operation time of the GFIS. In the emitter tip of the present embodiment, the triangular pyramid-shaped protrusion having a single atom at the apex thereof is formed so as to be in contact with the curved surface of the base body portion of the emitter tip, and hence the apex of the protrusion is not moved by the reproduction. Therefore, the change in the extraction voltage Vex due to the reproduction is very small, and hence even when the reproduction is performed several times per week, the change in the extraction voltage Vex of 12 kV is as small as less than 100V. Of course, the change in the extraction voltage Vex per one reproduction is 1% or less.

In the ordinary ion optical system 300 shown in FIG. 1, the ion source side of the first stage electrostatic lens 102-1 is configured as an acceleration lens with application voltage of up to the final acceleration voltage. In the case where the amount of change in the ion extraction voltage is about 1% or less, the change in the effect of the acceleration lens can be neglected, and hence the emitter tip 1 needs not to be realigned with respect to the first stage electrostatic lens 102-1. For this reason, a normal sample image can be acquired by slightly adjusting the strength of the objective lens 102-2. Note that, in the conventional reproduction method using three atoms which are exposed at the apex of the emitter tip at the time when a plurality of layers of atoms at the apex of the emitter tip are peeled by field evaporation, the extraction voltage Vex is changed by about 500V for each regeneration, and hence the alignment work described above is required.

(Selection of Tip Structure of Emitter Tip)

As described above, in the emitter tip of the present embodiment, it is aimed that a protrusion (pyramid) having a single atom at the apex thereof is formed at the apex of the emitter tip and then the angular current density is increased by reducing the emission angle from the single atom at the apex. However, a method is considered in which the single atom at the apex of the protrusion is deliberately peeled so as to form the three-atom state at the apex. In this method of using the three-atom state, the effect of increasing the angular current density is reduced to one-third, but this method has an advantage that the time until the reproduction of the emitter tip can be extended because the likelihood for the peeling of the atom at the tip of the emitted chip becomes higher in the case of three atoms than in the case of single atom.

Therefore, the ion beam device 200 according to the present embodiment is configured such that the control system displays a user interface screen on the screen of the display 110, so as to allow the user to select the single atom structure or the three atom structure as the tip structure of the emitter tip and to determine respective control parameters according to the selected tip structure. In the case where the emitter tip is used in the three atom structure, a process of peeling only a single atom at the apex of the emitter tip by field evaporation is added to the reproduction process of the emitter tip.

(Manufacturing Method of Emitter Tip Coated with Noble Metal)

The manufacturing method of the emitter tip of the present embodiment exemplified in FIG. 4 relates to a method for forming a nanotip at the apex of the emitter tip by coating a noble metal on a W single crystal, and the method itself is new. This is because the manufacturing method of the emitter tip is newly developed to respond to the requirement which is the necessary condition of the present invention, and in which a protrusion (pyramid) having a single atom at the apex thereof is formed at the apex of the emitter tip subsequently to the process of adjusting the curvature of the apex of the emitter tip by field evaporation. For example, the manufacturing method described in Non Patent Literature 2 cannot satisfy the above-described condition.

In the emitter tip according to the present embodiment, a reservoir is provided which serves as an atom supply source at the time when the single atom (here noble metal: Ir) at the apex is reproduced by the manufacturing method described above. The tungsten oxide layer formed at the root of the emitter tip is coated with Ir, so that the root of the emitter tip serves as the reservoir. At the apex of the emitter tip, the tungsten oxide layer is peeled by field evaporation, and hence Ir is easily diffused by heating. However, since the oxide layer is formed at the root of the emitter tip, Ir is hardly diffused and hence is retained at the root. When the apex of the emitter tip is reproduced, Ir can be sufficiently supplied to the apex of the emitter tip from the reservoir portion by low-temperature heating. In the conventional method in which a noble metal is coated on the emitter tip after the oxide layer is removed from the whole emitter tip, there is no portion serving as the reservoir. Therefore, when the reproduction of the apex of the emitter tip is repeated, the supply of the noble metal is exhausted, and the reproduction cannot be performed. In contrast, the emitter tip of the present embodiment has an advantage that the capability of reproducing the apex of the emitter tip can be maintained for a long time.

In the above, the base body of the emitter tip 1 in the present embodiment is assumed to be a W single crystal. However, any material, which enables a protrusion (pyramid) having a single atom at the apex thereof to be formed at the apex of the emitter tip, may be used, and a single crystal of a material, such as molybdenum (Mo), having a high melting point can be used. If possible, a material, which is hardly peeled by an electric field, is preferred and, as far as known, W is most suitable. Further, in the present embodiment, Ir is used as the noble metal coated on the surface of the emitter tip 1, but any material may be used which enables a protrusion (pyramid) having a single atom at the apex thereof to be formed at the apex of the emitter tip at the time when the material is annealed together with the base body of the emitter tip. Platinum (Pt), palladium (Pd), and the like, can be used as the noble metal coated on the surface of the emitter tip 1. However, since this noble metal atom is used as the single atom at the apex of the protrusion, a material, which is hardly peeled by an electric field, is preferred and, as far as known, Jr is most suitable.

<Second Embodiment>

Subsequently, another embodiment will be described. Note that the configuration of the ion beam device according to the present embodiment is the same as the ion beam device 200 (FIG. 1) according to embodiment 1. Further, the configuration of the GFIS according to the present embodiment is the same as the configuration of the GFIS 100 shown in FIG. 2. The present embodiment is different from embodiment 1 only in the characteristics of the emitter tip 1 mounted in the GFIS. The emitter tip according to embodiment 1 has the characteristics corresponding to the plot 5010 shown in FIG. 3A, while an emitter tip having the characteristics corresponding to the plot 5011 shown in FIG. 3A is used as the emitter tip 1 according to the present embodiment.

(Manufacturing Method of Emitter Tip)

In the emitter tip 1 corresponding to the plot 5010 mounted in embodiment 1, field evaporation in process 6002 is performed at 25 kV, and the extraction voltage Vex of helium is 12.2 kV.

On the other hand, in the emitter tip 1 corresponding to the plot 5011 and mounted in the embodiment 2, field evaporation in process 6002 is performed at 29 kV, and the extraction voltage Vex of helium is set to 15.6 kV.

The ratio of the extraction voltage Vex to the field evaporation voltage in the latter is about 10% higher than that in the former. This is because the voltage applied for field evaporation is usually continuously gradually increased, but on the other hand, in the latter, the voltage was increased stepwise from 25 kV to 29 kV at high speed. The voltage was increased at the rate of at least 5 kV/s or more. It is estimated that this phenomenon is due to the fact that the peeling area is spread at the same time in the case of high-speed field evaporation and thereby the amount of peeling is nonlinearly increased. If this phenomenon is properly controlled, the withstand voltage of the manufacturing apparatus of the emitter tip can be reduced.

When helium gas at pressure of about 0.5 Pa was supplied in the vicinity of the emitter tip 1 according to the present embodiment and when the applied extraction voltage was slightly increased from the best image extraction voltage to the gas supply limitation region so as to maximize current, the emission current from the single atom at the tip (apex) of the emitter tip 1 was 460 pA, and the emission half-opening angle θ from the single atom was about 0.4°. The emission half-opening angle of this emitter tip 1 is reduced to a half of the emission half-opening angle of the conventional emitter tip 1. Note that the angular current density is about 2.8 µA/sr.

<Third Embodiment>

Further, another embodiment will be described. Note that the configuration of the ion beam device according to the present embodiment is the same as the ion beam device 200 (FIG. 1) according to embodiment 1. Further, the configuration of the GFIS according to the present embodiment is the same as the configuration of the GFIS 100 shown in FIG. 2. The present embodiment is different from embodiment 1 only in the composition of the emitter tip 1 mounted in the GFIS. Specifically, a case is assumed in which the whole portion of the emitter tip 1 is made of W.

(Manufacturing Method of Emitter Tip)

Figure 8:
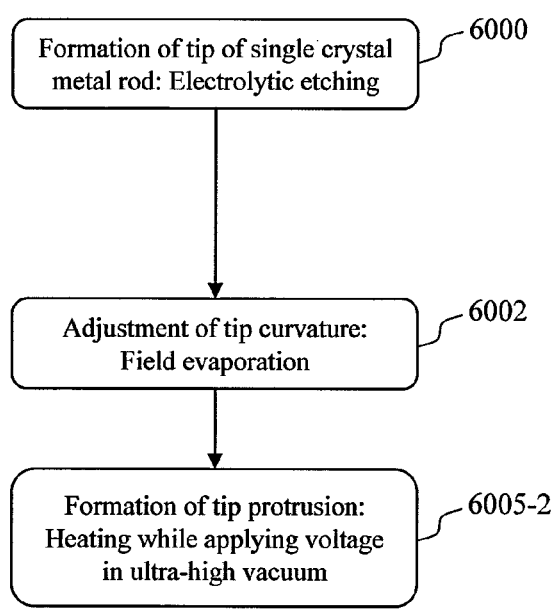
FIG. 8 is a view for explaining an example of another process of forming an emitter tip according to an embodiment.

FIG. 8 shows a manufacturing method of an emitter tip 1 according to the present embodiment. The emitter tip 1 is basically manufactured by using a device group different from the GFIS 100, but process 6002 and processes subsequent to process 6002 can be performed by the GFIS. Note that in FIG. 8, processes corresponding to the processes in FIG. 4 are denoted by the same reference numerals.

First, in process 6000, the tip of a single crystal rod is formed in a needle-like shape by electrolytic etching. The contents of the process are common to the contents in the case of embodiment 1. That is, the process is the same as process 6000 in FIG. 4.

Next, in process 6002, the tip of the W single crystal rod is subjected to field evaporation, so that the curvature of the tip of the base body of the W single crystal rod is adjusted. The contents of this process are also common to the case of Embodiment 1. That is, the contents of this process are the same as the contents in process 6002 in FIG. 4.

Next, in process 6005-2 specific to the present embodiment, a triangular pyramid-shaped protrusion (pyramid) is formed on the crystal face (111) at the tip of the W single crystal rod. The emitter tip 1 is heated for about 10 minutes at about 830° C. in ultra-high vacuum while a positive electric field of about 2 kV is applied to the apex of the emitter tip 1. By this heating, a triangular pyramid-shaped protrusion (pyramid) having a single atom at the apex thereof can be formed at the tip portion of the base body of the emitter tip.

The process shown in FIG. 8 has the following in common with the forming process of the emitter tip in embodiment 1 shown in FIG. 4. That is, after the apex of the emitter tip is formed by field evaporation under the application voltage of 20 kV or more, a pyramid-shaped or cone-shaped protrusion is formed at the apex of the emitter tip. Thereby, ions emitted from the apex of the protrusion are sufficiently influenced by the electric field of the whole emitter tip, so that the emission angle of the ions is narrowed by this lens effect.

Also in the present embodiment, a high angular current density is obtained similarly to embodiment 1. Further, in the case where the tip shape is changed in the same emitter tip as that in the present embodiment, the change of the reciprocal of the emission solid angle with respect to the extraction voltage is completely the same as that shown in FIG. 3A of embodiment 1. Note that in the present embodiment, the atom at the apex of the protrusion formed at the apex of the emitter tip is W and hence is different from the Ir atom at the apex of the protrusion formed at the apex of the emitter tip in embodiment 1. For this reason, the field evaporation voltage of the apex atom and the extraction voltage Vex of helium ions in the present embodiment are slightly different from those in embodiment 1. However, each of the differences is as small as 1 kV or less, and hence their influence on the above description can be neglected.

(Reproduction of Tip of Emitter Tip Based on Preset Conditions)

The life of the emitter tip according to the present embodiment is also determined by impurity gas contained in the imaging gas (here helium) similarly to the case described in embodiment 1. However, if the lost atom at the tip of the emitted chip can be automatically reproduced in the ion source device in a short time, the substantial life of the emitter tip is not exhausted. In the emitter tip of the present embodiment, the single atom at the apex of the emitter tip can be reproduced in process 6005-2 in FIG. 8. Of course, also in the case where several atoms at the tip of the emitted chip are lost, the lost atoms can be similarly reproduced. By execution of process 6005-2, atoms are rearranged at the apex of the emitter tip, so that a protrusion (pyramid) having a single atom at its apex is formed at the apex of the emitter tip.

Since process 6005-2 is performed in vacuum, the time required for the reproduction of the protrusion is about 1 hour when the exhaustion and injection of gas is taken into consideration. The heating of the emitter tip is performed by local energization, and hence the temperature of the portion performing conduction cooling of the portion of the emitter tip is maintained at a low temperature.

The detailed conditions of the reproduction process described above may be fixed conditions (preset conditions) which are determined beforehand independently of the state of the emitter tip, and hence require no determination by the user. Therefore, there is no difficulty in configuring the control system so that the emitter tip is automatically reproduced on the basis of the preset conditions.

Note that the heating temperature and the heating time in process 6005-2 can also be reduced as compared with the heating temperature and the heating time at the time when the apex of the emitter tip is first formed. This is because the amount of material to be moved at the time of formation of the protrusion is reduced.

(Influence on Alignment by Reproduction of Emitter Tip)

In the emitter tip of the present embodiment, the triangular pyramid-shaped protrusion having a single atom at the apex thereof is formed so as to be in contact with the curved surface of the base body portion of the emitter tip, similarly to the description in embodiment 1. For this reason, the apex of the protrusion is not moved by the reproduction. Therefore, the change in the extraction voltage Vex at the time of reproduction of the apex of the emitter tip of the present embodiment is also very small, similarly to the description in embodiment 1. In practice, even when the reproduction is performed several times per week, the amount of change in the extraction voltage Vex is 1% or less. For this reason, even if the above-described reproduction process is performed, the realignment of the ion optical system needs not to be performed. Note that, in the conventional reproduction method using three atoms which are exposed at the apex of the emitter tip at the time when a plurality of layers of atoms at the apex of the emitter tip are peeled by field evaporation, the extraction voltage Vex is changed by about 500V for each regeneration, and hence the alignment work of the ion optical system described above is required.

(Selection of Tip Structure of Emitter Tip)

In the emitter tip of the present embodiment, when the single atom at the apex is lost, the probability that the lost single atom can be reproduced is low as compared with the case of embodiment 1. For this reason, the reproduction process needs to be repeated many times. It is estimated that this is because the supply source of the single atom (here W atom) at the apex, which supply source is provided in embodiment 1, is not specifically provided. To cope with this, a method is considered in which the single atom at the apex is deliberately peeled so as to form a three-atom state at the apex. In this method of using the three-atom state, the effect of increasing the angular current density is reduced to ⅓, but this method has an advantage that the time until the reproduction of the emitter tip can be extended because the likelihood for the peeling of the atom at the tip of the emitted chip becomes higher in the case of three atoms than in the case of single atom.

The ion beam device 200 according to the present embodiment is also configured such that the control system displays a user interface screen on the screen of the display 110 so as to allow the user to select the single atom structure or the three atom structure at the apex of the emitter tip and to determine respective control parameters according to the selected tip structure. In the case where the emitter tip is used in the three atom structure, a process of peeling only a single atom at the apex of the emitter tip by field evaporation is added to the reproduction process of the emitter tip. <Examples of Other Forms>

In the above, preferred embodiments configured by application of the present invention are described. However, the method for forming, at the apex of the emitter tip, a pyramid-shaped or cone-shaped protrusion having a single atom at the apex thereof is not limited to the methods of embodiment 1 and embodiment 3 described above. It is possible to consider various methods such as, for example, a method for etching the apex of the emitter tip by applying an electric field to the emitter tip in the atmosphere of nitrogen (N2). Further, the gas for ionization is not limited to He, and rare gas such as neon (Ne) and argon (Ar), and hydrogen ($H_2$), and the like, can be used.

REFERENCE SIGNS LIST

1: Emitter tip
2: Extraction electrode
3: Gas injection port portion of gas supply pipe
4: Extraction voltage supply section
5: Ion beam
6: Sample
7: Secondary electron
10: Vacuum chamber
11: Vacuum pumping port
13: Differential pumping port
20: Cold head
21-1, 21-2: Heat transfer mesh wire (oxygen-free copper)
22-1, 22-2: Heat transfer support body (oxygen-free copper)
23-1: Heat transfer insulator (sapphire)
24-1: Heat insulation support body (stainless steel thin pipe)
30: Gas supply pipe
31: Gas cylinder
32: Valve
40-1, 40-2: High voltage feedthrough
100: Gas field ion source
101: Sample stage
102: Lens system
102-1, 102-2: Electrostatic lens
102-3: Beam-limiting aperture
102-4: Aligner
103: Deflection system
103-1, 103-2: Deflector
104: Secondary electron detector
105: Lens system controller
106: Deflection system controller
110: Display
200: Ion beam device
300: Ion optical system
301: Ion optical axis
400: Support body
450: Horizontal fine movement mechanism
451: Vacuum bellows
452: Sliding surface
453: Push rod
454: Pushing spring
500: Tip assembly
600: Inclination spacer

The invention claimed is:

1. A gas field ion source comprising:
an emitter tip configured to have a conductive needle-like tip and held in vacuum;
an extraction electrode configured to have an opening at a position separated from the emitter tip in the tip direction of the emitter tip;
a gas supply pipe configured to supply gas to the vicinity of the apex of the emitter tip; and
an extraction voltage application means configured to apply an extraction voltage between the emitter tip and the extraction electrode, so as to form an electric field for ionizing the gas, wherein:
at least the base body of the emitter tip is a single crystal metal, and
the apex of the emitter tip has a pyramid shape or a cone shape having a single atom at the top, and the emitter tip with the single atom at the top has a shape configured to satisfy at least one of the following conditions:
(A) a minimum threshold value voltage at which the single atom is field-evaporated is 11 kV;
(B) the extraction voltage being the extraction voltage that is applied by the extraction voltage application means when an ion beam generated from the single atom in the case of ionizing helium gas satisfies conditions to form a best image is a minimum voltage of 10 kV; and
(C) a maximum emission half-opening angle of the ion beam from the single atom in the case of ionizing helium gas is 0.7°.

2. The gas field ion source according to claim 1, wherein:
the single crystal, which is at least the base body of the emitter tip, is tungsten, and the crystal orientation of the tungsten is aligned in the longitudinal direction of the emitter tip.

3. The gas field ion source according to claim 1, wherein:
the surface of the apex of the emitter tip is coated with a noble metal.

4. The gas field ion source according to claim 1, wherein:
in the case where the single atom at the top is lost, the single atom can be reproduced at the apex simply by processing based on a preset condition including heat treatment in vacuum or in an arbitrary gas.

5. A method of using a gas field ion source, wherein:
the preset condition in the gas field ion source according to claim 4 is automatically set according to selection information about whether the gas field ion source is used in a state in which the single atom at the top is reproduced and maintained, or in a state in which only the single atom at the top is peeled and three atoms are arranged at the apex.

6. An ion beam device comprising:
the gas field ion source according to claim 1;
a sample stage configured to hold a sample;
a lens system configured to accelerate and converge ions emitted from the ion source and to irradiate the ions onto the sample;
a deflection system configured to deflect the ions to change the irradiation position of the ions on the sample;
a secondary particle detector configured to detect secondary particles emitted from the sample;
a means configured to form a secondary particle image by making a secondary particle signal obtained from the secondary particle detector correspond to the deflection of the ions; and
a means configured to receive an input designating an irradiation position of the ions on the secondary particle image displayed on a screen.

7. The ion beam device according to claim 6, comprising:
a control system configured to make a user select whether the ion beam device is used in a state in which the single atom at the top of the emitter tip configuring the gas field ion source is reproduced and maintained, or in a state where only the single atom at the top is peeled and three atoms are arranged at the apex, the control system being configured to automatically perform reproduction processing of the apex of the emitter tip according to the selected state of the atom at the apex.

8. The gas field ion source according to claim 1, wherein the emitter tip having the single atom at the top has the shape configuration which satisfies at least condition (A) of conditions (A)-(C).

9. The gas field ion source according to claim 1, wherein the emitter tip having the single atom at the top has the shape configuration which satisfies at least condition (C) of conditions (A)-(C).

* * * * *